United States Patent [19]

Taniguchi et al.

[11] Patent Number: 5,609,985
[45] Date of Patent: Mar. 11, 1997

[54] COLOR IMAGE-FORMABLE MATERIAL AND PROCESS FOR PREPARING THE SAME

[75] Inventors: Tetsuya Taniguchi; Kiyoshi Goto; Takeo Akiyama; Miyuki Hosoi, all of Hino; Tetsuya Masuda, Machida; Hideaki Mochizuku, Yokohama, all of Japan

[73] Assignees: Konica Corporation; Mitsubishi Chemical Corporation, both of Tokyo, Japan

[21] Appl. No.: 309,400

[22] Filed: Sep. 20, 1994

[30] Foreign Application Priority Data

Sep. 22, 1993 [JP] Japan .................................. 5-259338

[51] Int. Cl.$^6$ .............................. G03C 1/805; G03F 7/11
[52] U.S. Cl. ......................... 430/259; 430/143; 430/166; 430/257; 430/260; 430/262; 430/263; 430/271.1
[58] Field of Search .................................. 430/259, 257, 430/262, 263, 260, 271.1, 166, 143

[56] References Cited

U.S. PATENT DOCUMENTS

| | | | |
|---|---|---|---|
| 4,985,337 | 1/1991 | Sasa et al. | 430/263 |
| 5,059,509 | 10/1991 | Mino et al. | 430/257 |
| 5,183,723 | 2/1993 | Platzer et al. | 430/257 |

FOREIGN PATENT DOCUMENTS

| | | |
|---|---|---|
| 0281031 | 9/1988 | European Pat. Off. . |
| 0529537A1 | 3/1993 | European Pat. Off. . |

OTHER PUBLICATIONS

Patent Abstracts of Japan, vol. 15, No. 196 (P–1203) (1991) of JP-A-03 048 248.

Database WPI, Derwent Publications Ltd., London, GB; AN 94-121496 of JP-A-667 414 (1994).

*Primary Examiner*—John S. Chu
*Attorney, Agent, or Firm*—Frishauf, Holtz, Goodman, Langer & Chick, P.C.

[57] ABSTRACT

Disclosed are a color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image portion alone to an image-receiving material, wherein the surface at a color light-sensitive layer side of the cushion layer has an average gloss (GS (60°)) of 30 or more and the color light-sensitive layer is provided on the cushion layer, a process for preparing the same.

16 Claims, No Drawings

COLOR IMAGE-FORMABLE MATERIAL AND PROCESS FOR PREPARING THE SAME

BACKGROUND OF THE INVENTION

This invention relates to a color image-formable material suitable for preparing a color proof for color correction in color printing, a process for preparing the same and a method of forming a transferred image using the same, particularly to a color image-formable material by which a color proof more approximate to a print can be obtained, a process for preparing the same and a method of forming a transferred image using the same.

It has been well known in this field of the art that a color sheet (also called a color proof) for color correction is used for the purpose of saving labor and time for proof printing which is carried out as a previous step of final printing in multicolor printing.

As a method of forming a multicolor transferred image by using a color sheet for color correction, there may be mentioned, for example, a direct transfer method in which a color image is directly transferred to and laminated on a final image-receiving paper described in Japanese Provisional Patent Publication No. 41830/1972, an indirect transfer method in which a color image is temporarily transferred to a temporary (image-receiving) sheet described in Japanese Provisional Patent Publications No. 97140/1984 and No. 189535/1986 and a method of repeating steps of transferring a color light-sensitive layer to an image-receiving paper and then forming an image described in Japanese Provisional Patent Publication No. 50127/1981.

In all of the methods described above, the surface of an image-receiving material on which an image is formed is covered with an organic polymer layer so that gloss of the surface of the resulting image is too high, whereby there is a problem of giving an impression different from quality of an image obtained by final printing. Particularly in the method of Japanese Provisional Patent Publication No. 189535/1986, a non-image portion is covered with an organic polymer layer (a polymer layer), whereby there is a problem that inherent gloss and feel of a material cannot be obtained.

In order to solve the above problems, there has been proposed a method in which only a color image is transferred to and laminated on an image-receiving material to obtain a multicolor image (Japanese Provisional Patent Publication No. 48248/1991). In this method, an image-receiving material is not covered with an organic polymer layer so that in principle, it is possible to obtain an image extremely approximate to quality of an image obtained by final printing. The present inventors have found that in a color image-formable material used in the method of transferring only an image portion, only an image is transferred from a heat-softening layer (a cushion layer) to an image-receiving layer at the time of heat lamination so that there is a problem that uniformity of coating and also uniformity of an image portion density may be sometimes impaired by convex portions formed by gellation of a resin in the cushion layer, whereby approximation of a print is impaired.

SUMMARY OF THE INVENTION

An object of the present invention is to provide a color image-formable material which can solve the above problems of the prior art and can give a color proof more approximate to a print, a process for preparing the same and a method of forming a transferred image using the same, particularly to provide a color image-formable material which ① can give a color proof having surface characteristics of an image portion and a non-image portion equivalent or approximate to those of a print and ② can give a color proof approximate to a print by controlling non-uniformity of an image portion caused by a surface portion of a cushion layer, a process for preparing the same and a method of forming a transferred image using the same.

The above object of the present invention can be accomplished by the following present inventions 1 to 9:

1. A color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image portion alone to an image-receiving material, wherein the surface at a color light-sensitive layer side of the cushion layer has an average gloss (GS (60°)) of 30 or more and the color light-sensitive layer is provided on the cushion layer.

2. The process of the present invention 1 wherein the color light-sensitive layer is provided after making the average gloss (GS (60°)) of the surface at the color light-sensitive layer side of the cushion layer 30 or more.

3. The process of the present invention 2 wherein the process comprises, after providing the cushion layer, laminating a cover sheet on the cushion layer; then peeling the cover sheet and providing the color light-sensitive layer by coating on the peeled surface.

4. The process of the present invention 3 wherein the surface at a cushion layer side of the cover sheet has an average gloss (GS (60°)) of 30 or more and an average center line roughness (Ra) of 0.3 μm or less.

5. The process of the present invention 3 wherein the surface of the cushion layer is subjected to mirror finishing treatment after peeling the cover sheet and before providing the color light-sensitive layer.

6. The process of the present invention 1 wherein the cushion layer contains a polymer having vinyl carboxylate as a polymerization unit, and an amount of a polymerized portion derived from said vinyl carboxylate is 11% by weight or less based on-the total amount of the polymer.

7. A method of forming a transferred image, which comprises the steps of:

obtaining a transferred image on an image-receiving material by using a color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image alone to an image-receiving material; and subjecting a transferred color image portion to surface treatment so that the average gloss (GS (75°)) of the surface of the transferred color image portion is 60 or more.

8. The method of the present invention 7 wherein the surface treatment is calendering.

9. A color image-formable material which comprises a support, a cushion layer provided on the support and a color light-sensitive layer containing a light-sensitive composition and a coloring agent provided on the cushion layer and gives a transferred image by forming a color image portion by imagewise exposure and developing treatment and then transferring the color image portion alone to an image-receiving material, wherein the cushion layer has $10/m^2$ or less of convex portions which have a thickness 100 μm or more thicker than an average thickness of the cushion layer and exist on the surface thereof.

10. A color image-formable material which gives a transferred image by transferring a color image to an image-receiving material so that a color image portion and a non-image portion are covered with a thermoplastic organic polymer layer, wherein the thermoplastic organic polymer layer has a thickness of less than 0.08 μm.

In the present invention 10, there may be also used the following methods:

a method of forming a transferred image, which comprises the steps of:

obtaining a transferred image on an image-receiving material by using a color image-formable material which gives a transferred image by transferring a color image to an image-receiving material so that a color image portion and a non-image portion are covered with a thermoplastic organic polymer layer and subjecting the thermoplastic organic polymer layer to surface treatment so that the average gloss (GS (60°)) of the surface of the thermoplastic organic polymer layer is 30 or more;

the method of forming a transferred image described above wherein the surface treatment is calendering; and a method of forming a transferred image by using a color image-formable material which gives a transferred image by transferring a color image to an image-receiving material so that a color image portion and a non-image portion are covered with a thermoplastic organic polymer layer, wherein the thermoplastic organic polymer layer has $10/m^2$ or less of convex portions which have a thickness 100 μm or more thicker than an average thickness of the thermoplastic organic polymer layer and exist on the surface thereof.

As a method used for a color proof for color correction in color printing, there have been known a method described in Japanese Provisional Patent Publication No. 48248/1991 and a method described in Japanese Provisional Patent Publication No. 189535/1986. As to the method of Japanese Provisional Patent Publication No. 48248/1991, the present inventors have found that there is a problem that the surface of the cushion layer is matted to impair gloss of an image portion of a final image or uniformity of coating and also uniformity of an image portion density are impaired by convex portions formed by gelation of a resin in the cushion layer, whereby approximation of a print may be sometimes impaired. In the method of Japanese Provisional Patent Publication No. 189535/1986, a non-image portion is covered with a polymer layer, whereby there is a problem that inherent gloss and feel of a material cannot be obtained. These problems can be solved by the present inventions 1 to 10, and the specific task described in the above ① can be accomplished by the present inventions 1, 7 and 10 and the specific task described in the above ② can be accomplished by the present invention 6, 7 and 9. The present inventions 2, 3, 4 and 5 relates to a practicing means for effecting the present invention 1 and the present invention 8 is a practicing means for effecting the present invention 7.

DESCRIPTION OF THE PREFERRED EMBODIMENTS

In the following, the present invention is explained in detail.

In the present invention 1, the surface at a color light-sensitive layer side of the cushion layer has an average gloss (GS (60°)) of 30 or more, preferably 70 or more, more preferably 100 or more. A means for obtaining such surface gloss of the cushion layer is not limited and there may be used, for example, the process of the present invention 3. As the lamination method of the present invention 3, there may be used various lamination methods described below.

The average gloss mentioned in the present specification means a value measured according to the method of JIS Z 8741 wherein Method 3 thereof corresponds to ISO 2813-1978 (Paints and varnishes-Measurement of specular gloss of non-metallic paint film at 20°, 60° and 85°), or ASTM D 523-80 (Standard Test Method for SPECULAR GLOSS).

When the cover sheet is peeled off, a peeling angle from the surface of the cushion layer is preferably 90° or less, particularly preferably 80° or less. As the cover sheet to be used, the cover sheet of the present invention 4 is particularly preferred. Alternatively, the color image-formable material of the present invention 1 can be obtained by using the process of the present invention 5 without limiting the cover sheet to be used and nor limiting the above peeling angle. As a matter of course, it is preferred to combine the present invention 3 and/or the present invention 4 with the present invention 5. A means for mirror finishing in the present invention 5 is not particularly limited and mirror finishing may be carried out by, for example, softening the cushion layer by heating without applying pressure and using its leveling property, or applying pressure by a mirror finishing roll (in combination of heating, if necessary).

In the present invention 6, the polymerized portion other than the polymerized portion derived from vinyl carboxylate is preferably a polymerized portion derived from an olefin type compound. The olefin type compound is particularly preferably ethylene and described in detail below.

The present invention 7 is effective for accomplishing the tasks of the present invention mentioned in the above ① and ②. As a practicing means of the present invention 7, for example, the present invention 8 is used. As a practicing means of the present invention 9, it can be accomplished by the present invention 8 or calendering processing of the cushion layer.

In the present invention 10, i.e., in the color image-formable material which gives a transferred image by transferring a color image to an image-receiving material so that a color image portion and a non-image portion are covered with a thermoplastic organic polymer layer, the structure of such a color image-formable material is not particularly limited, and there may be preferably used, for example, the structure described in Japanese Provisional Patent Publication No. 189535/1986 described above. In such a structure, particularly when the thickness of the thermoplastic organic polymer layer is made less than 0.08 μm, the resulting color proof has extremely improved approximation to a print. Particularly when the thickness is made 0.05 μm or less, further 0.03 μm or less, approximation to a print is satisfactory. That is, in a method of forming a transferred image in which an image layer formed on a light-sensitive material which can transfer an image is transferred to an image-receiving sheet material and then a transferred image is transferred again to a permanent support (an image-receiving material), it is preferred to use a color image-formable material in which the image-receiving sheet material comprises a support, a first layer comprising a first organic polymeric compound provided on the support and a second layer comprising a second organic polymeric compound provided on the first layer; when the image layer which can be transferred is transferred to the image-receiving sheet material and then the image-receiving sheet material and the light-sensitive material which can transfer an image are peeled off from each other, adhesiveness P1 between the support and the first layer, adhesiveness P2 between the first layer and the second layer and adhesiveness P3 between the second layer and the image layer are larger than adhesiveness P4 between the image layer which can be transferred and the support of the image; and when the image layer is transferred again to the permanent support and the image-receiving sheet material and the permanent support are peeled off from each other, adhesiveness P5 between the permanent support and the image layer which can be transferred, as well as P1 and P2 are larger than P3, or P5, as well as P1 and P3 are larger than P2, wherein the second layer comprising the second organic polymeric compound has a thickness of less than 0.08 μm.

In the present invention 10, a transferred image obtained on a final image-receiving material is covered with a thermoplastic organic polymer layer. Surface treatment by which the surface of the thermoplastic organic polymer layer has an average gloss (GS (60°)) of 30 or more is not particularly limited and, for example, calendering may be suitably used. As such calendering, there may be used conventionally known and conventionally used various calendering techniques used for treating the surface of a thermoplastic organic polymer.

The color image-formable material of the present inventions 1 to 9 may have a protective layer on the color light-sensitive layer or may have other layer(s) (or sheet(s)).

In the following, the present invention is further explained in detail.

The color light-sensitive layer referred to in the present specification means a layer constitution wherein a light-sensitive material and a coloring agent are contained in one layer or a layer constitution wherein a layer containing a light-sensitive material and a layer containing a coloring agent are provided separately.

As the light-sensitive composition to be used in the color light-sensitive layer of the present invention, a known positive type light-sensitive composition or negative type light-sensitive composition may be used. As the positive type light-sensitive composition, a light-sensitive composition comprising an o-quinonediazide compound is preferably used. As the o-quinonediazide compound, any o-quinonediazide compound may be used so long as it can function as a light-sensitive agent.

As the o-quinonediazide compound, there may be suitably used, for example, a compound obtained by condensing 1,2-benzoquinonediazide-4-sulfonyl chloride, 1,2-naphthoquinonediazide-4-sulfonyl chloride, 1,2-naphthoquinonediazide-5-sulfonyl chloride or 1,2-naphthoquinonediazide-6-sulfonyl chloride with a compound having a hydroxyl group and/or an amino group.

As the compound having a hydroxyl group, there may be mentioned, for example, trihydroxybenzophenone, dihydroxyanthraquinone, bisphenol A, a phenol novolak resin, a resorcin benzaldehyde condensed resin and a pyrogallol acetone condensed resin. As the compound having an amino group, there may be mentioned, for example, aniline, p-aminodiphenylamine, p-aminobenzophenone, 4,4'-diaminodiphenylamine and 4,4'-diaminobenzophenone.

In addition to the above-mentioned, the o-quinonediazide compound is further described in J. Kosar, "Light-sensitive System" (published by John Willy & Sons Co. (New York) in 1965) and Nagamatsu and Inui, "Light-sensitive Polymer" (published by Kodansha (Japan) in 1977).

As the negative type light-sensitive composition, a photopolymerization type light-sensitive composition is preferred. As a photopolymerizable compound to be used in the composition, there may be used any photopolymerizable compound which has been generally used. For example, at least one compound optionally selected from the compound group consisting of acrylic acid, methacrylic acid, an acrylic acid ester and a methacrylic acid ester may be used. There may be mentioned, for example, ethylene glycol diacrylate, glycerin triacrylate, polyacrylate, ethylene glycol dimethacrylate, 1,3-propanediol dimethacrylate, 1,2,4-butanetriol trimethacrylate, polyethylene glycol dimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate and polyethylene glycol bisacrylate or bismethacrylate, but the present invention is not limited thereby.

In the negative type light-sensitive composition, a photopolymerization initiator may be contained. Any photopolymerizaion initiator may be used, but a photopolymerization initiator which absorbs less light at a visible portion is preferred. As an example of such a photopolymerization initiator, there may be mentioned the following compounds, but the present invention is not limited thereby. The compounds are an aromatic ketone such as benzophenone, Michler's ketone (4', 4'-bis (dimethylamino) benzophenone), 4,4'-bis (diethylamino) benzophenone, 4-methoxy-4'-dimethylaminobenzophenone, 2-ethylanthraquinone, phenanthraquinone and other aromatic ketones;

a benzoin ether such as benzoin, benzoin methyl ether, benzoin ethyl ether and benzoin phenyl ether;

a benzoin such as methyl benzoin, ethyl benzoin and other benzoins; and an imidazole dimer such as a 2-(o-chlorophenyl)-4,5-diphenylimidazole dimer, a 2-(o-chlorophenyl)-4,5-(m-methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4,5-diphenylimidazole dimer, a 2,4-di(p-methoxyphenyl) -5-phenylimidazole dimer, a 2-(2,4-dimethoxyphenyl) -4,5-diphenylimidazole dimer, a 2-(p-methylmercaptophenyl)-4,5-diphenylimidazole dimer and a 2,4,5-triacrylimidazole dimer which is similar to dimers described in U.S. Pat. No. 3,479,185, U.K. Patent No. 1,047,569 and U.S. Pat. No. 3,784,557.

As other photopolymerizable compound, a thioxanthone such as 2,4-diethylthioxanthone may be used. In this case, as a photopolymerization accelerator, a known compound, for example, isoamyl p-dimethylaminobenzoate, ethyl p-dimethylaminobenzoate, N-methyldiethanolamine or bisdiethylaminobenzophenone may be used.

The light-sensitive composition of the present invention may contain a known polymeric compound and a synthetic resin. Particularly in the present inventions 1 to 8, it is preferred that a polymeric compound having a vinyl carboxylate polymer unit represented by the following formula in its molecular structure is contained.

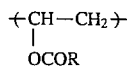

wherein R represents an alkyl group or a substituted alkyl group.

Any polymeric compound having a structure as described above may be used, but as a vinyl carboxylate monomer for constituting the polymer unit represented by the above formula, the following exemplary monomers are preferred. Compound names and chemical formulae thereof are shown below.

| 1. Vinyl acetate | $CH_3COOCH=CH_2$ |
|---|---|
| 2. Vinyl propionate | $CH_3CH_2COOCH=CH_2$ |
| 3. Vinyl butyrate | $CH_3(CH_2)_2COOCH=CH_2$ |
| 4. Vinyl pivalate | $(CH_3)_3CCOOCH=CH_2$ |
| 5. Vinyl caproate | $CH_3(CH_2)_4COOCH=CH_2$ |
| 6. Vinyl caprylate | $CH_3(CH_2)_6COOCH=CH_2$ |
| 7. Vinyl caprinate | $CH_3(CH_2)_8COOCH=CH_2$ |
| 8. Vinyl laurate | $CH_3(CH_2)_{10}COOCH=CH_2$ |
| 9. Vinyl myristate | $CH_3(CH_2)_{12}COOCH=CH_2$ |
| 10. Vinyl palmitate | $CH_3(CH_2)_{14}COOCH=CH_2$ |
| 11. Vinyl stearate | $CH_3(CH_2)_{16}COOCH=CH_2$ |
| 12. Vinyl versatate | $R^1-\underset{R^2}{\underset{|}{\overset{CH_3}{\overset{|}{C}}}}-COOCH=CH_2$ | wherein $R^1$ and $R^2$ each represent an alkyl group and the total carbon number of $R^1$ and $R^2$ is 7, i.e., $R^1+R^2=C_7H_{16}$.

The polymeric compound may be either a polymer obtained by polymerizing one vinyl carboxylate, a copolymer obtained by copolymerizing two kinds of vinyl carboxylates or a copolymer of vinyl carboxylate and other monomer which can be copolymerized with vinyl carboxylate with any component ratio.

As a monomer unit which can be used in combination with the polymer unit represented by the above formula, there may be mentioned an ethylenic unsaturated olefin such as ethylene, propylene, isobutylene, butadiene and isoprene;

a styrene such as styrene, α-methylstyrene, p-methylstyrene and p-chlorostyrene;

an acrylic acid such as acrylic acid and methacrylic acid;

an unsaturated aliphatic dicarboxylic acid such as itaconic acid, maleic acid and maleic anhydride;

a diester of an unsaturated dicarboxylic acid such as diethyl maleate, dibutyl maleate, di-2-ethylhexyl maleate, dibutyl fumarate and di-2-ethylhexyl fumarate;

an α-methylene aliphatic monocarboxylate such as methyl acrylate, ethyl acrylate, n-butyl acrylate, isobutyl acrylate, phenyl acrylate, methyl α-chloroacrylate, methyl methacrylate and ethyl ethacrylate;

a nitrile such as acrylonitrile and methacrylonitrile;

an amide such as acrylamide;

an anilide such as acrylanilide, p-chloroacrylanilide, m-nitroacrylanilide and m-methoxyacrylanilide;

a vinyl ether such as methyl vinyl ether, ethyl vinyl ether, isobutyl vinyl ether and β-chloroethyl vinyl ether;

vinyl chloride, vinylidene chloride and vinylidene cyanide;

an ethylene derivative such as 1-methyl-1-methoxyethylene, 1,1-dimethoxyethylene, 1,2-dimethoxyethylene, 1,1-dimethoxycarbonylethylene and 1-methyl-1-nitroethylene; and a vinyl type monomer such as a N-vinyl compound (e.g., N-vinylpyrrole, N-vinylcarbazole, N-vinylindote, N-vinylpyrrolidene and N-vinylpyrrolidone. These monomer units exist in the polymeric compound in a structure of a cleaved double bond.

As the polymeric compound to be used in the present invention, polymeric compounds having a vinyl acetate polymer unit in a molecular structure are particularly preferred. Among them, preferred are those having 40 to 95% by weight of a vinyl acetate polymer unit, a number average molecular weight (MN) of 1,000 to 60,000 and a weight average molecular weight (MW) of 500 to 150,000.

More preferred is a polymeric compound having a vinyl acetate polymer unit (particularly having 40 to 95% by weight of said unit) and a polymer unit of vinyl carboxylate having a chain longer than that of vinyl acetate, particularly having a number average molecular weight (MN) of 2,000 to 60,000 and a weight average molecular weight (MW) of 10,000 to 150,000.

In this case, a monomer which is copolymerized with vinyl acetate to constitute the polymeric compound having a vinyl acetate polymer unit may be any monomer so long as it is copolymerizable. The monomer can be optionally selected from, for example, the above exemplary monomers.

In the following, copolymers which can be used as the polymeric compound in the present invention are enumerated by showing monomer components thereof. As a matter of course, the present invention is not limited thereby.

1. Vinyl acetate-ethylene
2. Vinyl acetate-styrene
3. Vinyl acetate-crotonic acid
4. Vinyl acetate-maleic acid
5. Vinyl acetate-2-ethylhexyl acrylate
6. Vinyl acetate-di-2-ethylhexyl maleate
7. Vinyl acetate-methyl vinyl ether
8. Vinyl acetate-vinyl chloride
9. Vinyl acetate-N-vinylpyrrolidone
10. Vinyl acetate-vinyl propionate
11. Vinyl acetate-vinyl pivalate
12. Vinyl acetate-vinyl versatate
13. Vinyl acetate-vinyl laurate
14. Vinyl acetate-vinyl stearate
15. Vinyl acetate-vinyl versatare-ethylene
16. Vinyl acetate-vinyl versatate-2-ethylhexyl acrylate
17. Vinyl acetate-vinyl versatare-vinyl laurate
18. Vinyl acetate-vinyl versatate-crotonic acid
19. Vinyl propionate-vinyl versatate
20. Vinyl propionate-vinyl versatate-crotonic acid
21. Pivalic acid-vinyl stearate-maleic acid By using the light-sensitive composition of the present invention, an image-formable material can be prepared. For example, a color image-formable material which is used as a color proof can be prepared.

In this case, a color light-sensitive layer of the color image-formable material is removed imagewisely by development after imagewise exposure to form a color image portion.

To the color light-sensitive layer, a dye and/or a pigment is/are added as a coloring agent. Particularly when the color image-formable material is used for color correction, pigments and/or dyes having color tones corresponding to ordinary colors required for color correction, i.e., yellow, magenta, cyan and black are required, and also other metallic powders, a white pigment and a fluorescent pigment are used. When the present invention is applied to a color proof, the following various pigments and dyes which have been conventionally known in this field of the art may be used.

(C.I means a color index.)

| | |
|---|---|
| Victoria Pure Blue | (C.I 42595) |
| Auramine | (C.I 41000) |
| Carotene Brilliant Flavin | (C.I Basic 13) |
| Rhodamine 6GCP | (C.I 45160) |
| Rhodamine B | (C.I 45170) |
| Safranine OK 70:100 | (C.I 50240) |
| Erioglaucine X | (C.I 42080) |
| Fast Black HB | (C.I 26150) |
| No. 1201 Lionol Yellow | (C.I 21090) |
| Lionol Yellow GRO | (C.I 21090) |
| Symlar Fast Yellow 8GF | (C.I 21105) |
| Benzidine Yellow 4T-564D | (C.I 21095) |
| Symlar Fast Red 4015 | (C.I 12355) |
| Lionol Red 7B4401 | (C.I 15830) |
| Fastgen Blue TGR-L | (C.I 74160) |
| Lionol Blue SM | (C.I 26150) |

Mitsubishi Carbon Black MA-100 (trade name, produced by Mitsubishi Kasei Corporation)
Mitsubishi Carbon Black #30, #40 and #50 (trade names, produced by Mitsubishi Kasei Corporation)

When the coloring agent is used, the ratio of the coloring agent to components other than the coloring agent in the color light-sensitive layer can be determined according to a method known to those skilled in the art in consideration of target optical density and removing property to a developing solution of the color light-sensitive layer.

For example, in the case of a dye, the ratio is preferably 5% to 75% in terms of weight and in the case of a pigment, the ratio is preferably 5% to 90% in terms of weight.

The film thickness of the color light-sensitive layer can be determined according to a method known to those skilled in the art in consideration of target optical density, the kind of the coloring agent (dye, pigment or carbon black) used in the color light-sensitive layer and a content thereof. If the thickness is within a permissive range, when the thickness is as thin as possible, resolving power is heightened and image quality becomes good. Therefore, the film thickness is generally preferably in the range of 0.1 $g/m^2$ to 5 $g/m^2$.

When the present invention is practiced, a plasticizer and a coatability improving agent may be further added to the light-sensitive composition, if necessary.

As the plasticizer, there may be mentioned various low molecular weight compounds such as phthalic acid esters, triphenylphosphates and maleic acid esters. As the coatability improving agent, there may be mentioned a surfactant such as a fluorine type surfactant and a nonionic surfactant.

When an image-formable material, particularly a color image-formable material is prepared by using the light-sensitive composition of the present invention, the color light-sensitive layer may be divided into two layers of a color layer comprising a coloring agent and a binder and a light-sensitive layer comprising the light-sensitive composition. In this case, either of the two layers may be provided at a support side.

When an image-formable material is prepared by using the light-sensitive composition of the present invention, any support may be used, but a transparent support is preferably used. As the transparent support, a polyester film, particularly a biaxially stretched polyethylene terephthalate film is preferred in the point of dimensional stability to water and heat. Also, an acetate film, a polyvinyl chloride film, a polyethylene film, a polypropylene film and a polyethylene film may be used.

As a protective layer which is used, if necessary, any known protective layer may be used, but it is preferred to select its gas permeability depending on the kind of the light-sensitive composition to be used. That is, when the light-sensitive composition which generates gas at the time of exposure of o-quinonediazide and others is used, it is preferred to provide a protective layer having high gas permeability, and when the photopolymerization type light-sensitive composition is used, it is preferred to provide a protective layer having low gas permeability. Further preferred is a protective layer which is dissolved in a developing solution during development, particularly a protective layer comprising a water-soluble polymer such as polyvinyl alcohol and cellulose with a dry film thickness of about 0.01 to 5 μm, particularly about 0.03 to 1 μm.

The image-formable material can be used for transferring an image to an image-receiving material. For the purposes of effecting transfer to an image-receiving material with good efficiency and facilitating peeling of the support after transfer of an image, that is, for the purposes of heightening image transfer property and releasing property between the support, and the cushion layer and the image-formable layer (the color light-sensitive layer), the surface of the support may be subjected to finishing or molding so that said surface becomes a cushion, or a cushion layer may be provided on the surface of the support as described below.

The image-formable method of the present invention is to provide a transferred image by exposing and developing the image-formable material of the present invention to form an image portion and transferring at least image portion formed to an image-receiving material (e.g., printing paper).

When the image-formable method of the present invention is embodied as, for example, a method of forming a multicolor image, one basic method in the present inventions 1 to 8 is described below.

After a first color image is formed on a first color image-formable material, at least the first color image is transferred to an image-receiving material and a support is peeled off. After a second color image is formed on a second color image-formable material, the second color image is transferred on the first color image while registration of the second color register mark image formed thereby with the first color register mark image on the image-receiving material is conducted and a support is peeled off to obtain an image on which two colors are adjusted. In the same manner, a third color image and a fourth color image are transferred to the image-receiving material to obtain a multicolor image. Further, depending on the case, this multicolor image may be transferred indirectly to other image-receiving material to obtain a multicolor image.

This kind of method is disclosed in Japanese Provisional Patent Publications No. 41830/1972, No. 97140/1984 and No. 28649/1985 and U.S. Pat. No. 3,775,113.

In the image-formable method in the present inventions 1 to 9, the image-formable material is generally subjected to imagewise exposure through a color separation mask and then development to form an image. Here, only an image portion of the image obtained on a support is directly transferred to and laminated on an image-receiving material. That is, substantially only a color image layer forming the image is transferred and laminated. In this case, for the purposes of effecting transfer to the image-receiving material with good efficiency and facilitating peeling of the support after transfer of the image, the surface of the support is made a cushion or a cushion layer is provided on the support. In the present invention, the above cushion or cushion layer is called a cushion layer.

The thickness of the cushion layer is preferably 5 μm to 50 μm.

As a resin to be used in the cushion layer, a resin having a softening point of –30° C. to 150° C. is preferred. The softening point herein mentioned is a Vicat softening point or a value shown by the ring and ball method. In the present invention, as a specific preferred resin, there may be mentioned the following resins: a polyolefin such as polyethylene and polypropylene; an ethylene copolymer such as a copolymer of ethylene and vinyl acetate, ethylene and an acrylic acid ester or ethylene and acrylic acid; polyvinyl chloride; a vinyl chloride copolymer such as a copolymer of vinyl chloride and vinyl acetate; polyvinylidene chloride; a vinylidene chloride copolymer; polystyrene; a styrene copolymer such as a copolymer of styrene and maleic anhydride; polyacrylate; a polyester resin; a polyurethane resin; an acrylate copolymer such as a copolymer of acrylate and vinyl acetate; polymethacrylate; a methacrylate copolymer such as a copolymer of methyl methacrylate and vinyl acetate or methyl methacrylate and acrylic acid; polyvinyl acetate; a vinyl acetate copolymer; a vinyl butyral resin; a polyamide resin such as nylon, copolymer nylon and N-alkoxymethylated nylon; a synthetic rubber; a petroleum resin; a chlorinated rubber; polyethylene glycol; a cellulose derivative; cellulose acetate phthalate; cellulose acetate succinate; shellac; and a wax. Among these, particularly preferred are a polyolefin such as polyethylene and polypropylene; an ethylene copolymer such as a copolymer of ethylene and vinyl acetate, ethylene and an acrylic acid ester or ethylene and acrylic acid; polyvinyl acetate; and a vinyl acetate copolymer.

The polymer containing vinyl carboxylate or a vinyl carboxylic acid ester as a polymerization unit to be contained in the cushion layer of the present invention 6 means a polymer wherein, among the polymeric compound having the vinyl carboxylate unit in the molecular structure to be used in the aforesaid light-sensitive composition, a ratio of the polymer portion derived from the vinyl carboxylate is 11% by weight or less based on the total amount of the polymer. As the copolymer, the following copolymers may be used. Particularly preferred polymer may include an ethylene-vinyl acetate copolymer a weight ratio of which is preferably 90:10 to 92:8.

As specific examples of the polymer containing 11% by weight or less of the vinyl carboxylate unit, there may be mentioned, for example, a copolymer of ethylene and vinyl acetate (an amount of vinyl acetate is 11% by weight or less, e.g., a copolymer of ethylene and vinyl acetate in a weight ratio of 90:10, 92:8 or 94:6); a copolymer of ethylene and vinyl propionate (an amount of vinyl propionate is 11% by weight or less, e.g., a copolymer of ethylene and vinyl propionate in a weight ratio of 90:10, 92:8 or 94:6); a copolymer of ethylene and vinyl versatate (an amount of vinyl versatate is 11% by weight or less, e.g., a copolymer of ethylene and vinyl versatate in a weight ratio of 90:10, 92:8 or 94:6); a copolymer of ethylene, vinyl acetate and vinyl versatate (total amounts of vinyl acetate and vinyl versatate are 11% by weight or less, e.g., a copolymer of ethylene, vinyl acetate and vinyl versatate in a weight ratio of 90:5:5, 90:7:3 or 94:3:3); a copolymer of propylene and vinyl acetate (an amount of vinyl acetate is 11% by weight or less, e.g., a copolymer of propylene and vinyl acetate in a weight ratio of 90:10, 92:8 or 94:6); a copolymer of styrene and vinyl acetate (an amount of vinyl acetate is 11% by weight or less, e.g., a copolymer of styrene and vinyl acetate in a weight ratio of 90:10, 92:8 or 94:6); a copolymer of vinyl chloride and vinyl acetate (an amount of vinyl acetate is 11% by weight or less, e.g., a copolymer of vinyl chloride and vinyl acetate in a weight ratio of 90:10, 92:8 or 94:6); and a copolymer of butyl acrylate and vinyl acetate (an amount of vinyl acetate is 11% by weight or less, e.g., a copolymer of butyl acrylate and vinyl acetate in a weight ratio of 90:10, 92:8 or 94:6).

As a method of providing the cushion layer on the support, particularly the above transparent support, there may be mentioned the following methods:

(1) the so-called dry lamination method in which a solution obtained by dissolving polyvinyl acetate, polyvinyl chloride, an epoxy resin, a polyurethane type resin, a natural rubber or a synthetic rubber in an organic solvent is used as an adhesive, the adhesive is coated on a support and dried by hot air or heating and then a cover sheet is superposed on the support and pressed under heating to effect lamination;

(2) the so-called hot melt lamination method in which a copolymer of ethylene and vinyl acetate, a copolymer of ethylene and an acrylic acid ester, a polyamide resin, a petroleum resin, a rosin, a wax or a mixture of them is used as an adhesive, the adhesive is heated and coated on a support according to a doctor blade method, a roll coat method, a gravure method or a reverse roll method while the adhesive is kept in a melted state and a cover sheet is superposed on the support immediately after coating and heated at high temperature and then cooled, if necessary, to effect lamination;

(3) the so-called extrusion lamination method in which polypropylene or polyethylene is extruded on a support by an extruder while polypropylene or polyethylene is kept in a melted state and a cover sheet is pressed against the support while polypropylene or polyethylene is in a melted state to effect lamination; and (4) the so-called co-extrusion method in which a layer comprising two or more kinds of resins is formed on a support by one molding using plural molding machines and polypropylene or polyethylene in a melted state when a film to be used as a support is molded according to a melt extrusion method and a cover sheet is pressed against the support while the layer is in a melted state to effect lamination.

In all of the methods (1) to (4) described above, the cover sheet is necessarily superposed on the surface of the cushion layer after the cushion layer is provided on the support.

In the present invention 9, in a method of forming a transferred image in which an image layer formed on a light-sensitive material which can transfer an image is transferred to an image-receiving sheet material and then a transferred image is transferred again to a permanent support (an image-receiving material), it is preferred to use a color image-formable material in which the image-receiving sheet material comprises a support, a first layer comprising a first organic polymeric compound provided on the support and a second layer comprising a second organic polymeric compound provided on the first layer; when the image layer which can be transferred is transferred to the image-receiving sheet material and then the image-receiving sheet material and the light-sensitive material which can transfer an image are peeled off from each other, adhesiveness P1 between the support and the first layer, adhesiveness P2 between the first layer and the second layer and adhesiveness P3 between the second layer and the image layer are larger than adhesiveness P4 between the image layer which can be transferred and the support of the image layer; and when the image layer is transferred again to the permanent support and the image-receiving sheet material and the permanent support are peeled off from each other, adhesiveness P5 between the permanent support and the image layer which can be transferred, as well as P1 and P2 are larger than P3, or P5, as well as P1 and P3 are larger than P2, wherein the second layer comprising the second organic polymeric compound has a thickness of less than 0.08 µm. The above image-formable material and method of forming a transferred image are described in Japanese Provisional Patent Publication No. 189535/1986 mentioned above.

In the image-formable method of the present invention, as the developing solution to be used for developing the image-formable material, any developing solution may be used so long as it has an action of developing a material to be treated. It is preferred to use a developing solution containing an alikali agent and an anionic surfactant.

As the alkali agent which can be used, there may be mentioned:

(1) an inorganic alkali agent such as sodium silicate, potassium silicate, potassium hydroxide, sodium hydroxide, lithium hydroxide, sodium or ammonium secondary or tertiary phosphate, sodium metasilicate, sodium carbonate and ammonia; and (2) an organic amine compound such as mono-, di- or trimethylamine, moro-, di- or triethylamine, mono- or diisopropylamine, n-butylamine, mono-, di- or triethanolamine, mono-, di- or triisopropanolamine, ethyleneimine and ethylenediimine.

As the anionic surfactant which can be used, there may be mentioned:

(1) a higher alcohol sulfate such as a sodium salt of lauryl alcohol sulfate, an ammonium salt of octyl alcohol sulfate, an ammonium salt of lauryl alcohol sulfate and disodium alkylsulfate;

(2) an aliphatic alcohol phosphate such as a sodium salt of cetyl alcohol phosphate;

(3) an alkylarylsulfonate such as sodium dodecylbenzenesulfonate, sodium isopropylnaphthalenesulfonate, sodium dinaphthalenesulfonate and sodium metanitrobenzenesulfonate;

(4) an alkylamidesulfonate such as

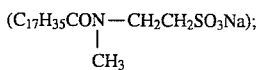

(5) a sulfonate of a dibasic aliphatic ester such as sodium sulfosuccinate dioctyl ester and sodium sulfosuccinate dihexyl ester; and (6) a formaldehyde condensate of an alkylnaphthalenesulfonate such as a formaldehyde condensate of sodium dibutylnaphthalenesulfonate.

The alkali agents and the anionic surfactants may be used in any desired combination.

EXAMPLES

The present invention is described in detail by referring to Examples and Comparative examples, but the present invention is not limited thereby.

COMPARATIVE EXAMPLE 1

On a polyethylene terephthalate film LUMIRROR T-60 (trade name, produced by Toray Co.) having a thickness of 75 µm, an ethylene-vinyl acetate copolymer resin EVAFLEX P-1407 (trade name, produced by Mitsui DuPont Polychemical Co., vinyl acetate content: 14% by weight, MFR (melt flow rate): 15) is formed so as to have a thickness of 25 µm by the extrusion lamination method to prepare a support having a cushion layer. At the same time, as a cover sheet of the cushion layer, a polyethylene terephthalate film LUMIMAT #200S (trade name, produced by PANAC CO.) having a thickness of 50 µm, one surface of which had been matted was laminated so that the matted surface (Ra=0.40 µm, measured by Perthometer S5P (trade name) manufactured by Perthen, average gloss (GS (60°))=8, measured according to JIS-Z8741 by using a digital goniophotometer VG 1D Model (trade name) manufactured by Nihon Denshoku Kogyo Co.) was in contact with the cushion layer.

The cover sheet of the support having the cushion layer prepared was peeled off so that an angle between the cover sheet and the cushion layer after peeling became 160°. The surface gloss and the number of convex portions of the surface of the cushion layer are shown in Table 1.

Next, color light-sensitive layer dispersions having the following composition were prepared.

| (Color light-sensitive layer dispersions) | |
| --- | --- |
| Esterified compound of p-cresol novolak resin and naphthoquinone-1,2-diazide-4-sulfonic acid chloride | 0.616 g |
| Vinyl acetate-vinyl versatate copolymer (weight ratio: 80:20, weight average molecular weight: 50,000, 50% methanol solution) | 8.768 g |
| Pigment shown below | Amount shown below |
| Methyl lactate | 35.2 g |
| (Pigment) | |
| Black: Carbon Black MA-100 (trade name, produced by Mitsubishi Kasei Corporation) | 0.99 g |
| Cyan: Lionol Blue FG-7330 (trade name, produced by Toyo Ink Co.) | 0.55 g |
| Magenta: Lionol Red 6BFG-4219X (trade name, produced by Toyo Ink Co.) | 0.68 g |
| Yellow: Lionol Yellow No. 1206 (trade name, produced by Toyo Ink Co.) | 0.68 g |

The above dispersions (coating solutions) were coated to have a dry film thickness of 1.8 µm and dried, respectively, to obtain light-sensitive color image-formable materials of four colors (four kinds).

On the polyethylene terephthalate film surfaces of the light-sensitive color image-formable materials of four colors obtained, color separation screen positive films of the respective colors were contacted closely. Then, the materials obtained were subjected to image exposure for about 60 seconds from a distance of 50 cm by a 4 kw metal halide lamp and then developed by dipping them in a developing solution shown below at 32° C. for 30 seconds and rubbing them with a sponge to obtain color images of four colors.

| (Developing solution) | |
| --- | --- |
| Konica PS printing developing solution SDR 1 (trade name, produced by Konica Corporation) | 40 ml |
| Pelex NB-L (trade name, produced by Kao Atlas Co., surfactant) | 100 ml |
| Distilled water | 400 ml |

Next, the image surface of the black color image and art paper Tokubishi Art (trade name, produced by Mitsubishi Seishi Co.) were contacted closely and passed between a pair of nip rolls heated to 80° C. under a pressurization condition of 5 kgf/cm² at a rate of 0.5 m/min. Immediately after passing between a pair of the nip rolls, the support was peeled off. Peeling was easily carried out at an interface of the cushion layer and the color image and the black color image was transferred to the art paper. Subsequently, the color images were transferred in the order of cyan, magenta and yellow to form a color proofing image of four colors on the art paper.

To the art paper, only the color image portions were transferred. That is, the surface of the art paper at a non-image portion was exposed and generation of background staining at the non-image portion was not observed.

The results of observation and evaluation of difference between the color proofing image and a print obtained by using the same manuscript and paper by 15 persons skilled in printing are shown in Table 3. The print to be observed was obtained by using the same manuscript, the same art paper Tokubishi Art (trade name, produced by Mitsubishi Seishi Co.), an ink Mark Five New (trade name, produced by Toyo Ink Co.) and a printer Mitsubishi DAIYA (trade name, manufactured by Mitsubishi Juko Co.). Also, the results of measurement of gloss at the image portion and the non-image portion of the color proofing image are shown in Table 3.

EXAMPLE 1

A color proofing image was prepared in the same manner as in Comparative example 1 except for changing the cover sheet of the cushion layer to a polyethylene terephthalate film Lumilar T-60 #50 (trade name, produced by Toray Co.) (Ra=0.15 μm, measured by Perthometer S5P (trade name) manufactured by Perthen, average gloss (GS (60°))=170 measured according to JIS-Z8741 by using a digital goniophotometer VG 1D Model (trade name) manufactured by Nihon Denshoku Kogyo Co.) having a thickness of 50 μm. The same evaluation and measurement were conducted as mentioned above. The results are shown in Table 3.

EXAMPLE 2

A color proofing image was prepared in the same manner as in Example 1 except for changing the peeling angle of the cover sheet to 80°. The same evaluation and measurement were conducted. The results are shown in Table 3.

EXAMPLE 3

A color proofing image was prepared in the same manner as in Example 1 except for heating the support in an oven of 100° C. for 1 minute after peeling the cover sheet and before coating the color light-sensitive layer. The same evaluation and measurement were conducted. The results are shown in Table 3.

EXAMPLE 4

A color proofing image was prepared in the same manner as in Example 1 except for heating the support in an oven of 100° C. for 2 minutes after peeling the cover sheet and before coating the color light-sensitive layer. The same evaluation and measurement were conducted. The results are shown in Table 3.

EXAMPLE 5

A color proofing image was prepared in the same manner as in Comparative example 1 except for passing the support between a pair of nip rolls (surface roughness Ra of rolls contacting the cushion layer: 0.05 μm) heated to 100° C. under a pressurization condition of 3 kgf/cm² at a rate of 0.5 m/min. The same evaluation and measurement were conducted. The results are shown in Table 3.

EXAMPLE 6

A color proofing image was prepared in the same manner as in Comparative example 1. The resulting color proofing image was passed between a pair of nip rolls (surface roughness Ra of rolls contacting the image surface: 0.15 μm) heated to 100° C. under a pressurization condition of 3 kgf/cm² at a rate of 2 m/min. The same evaluation and measurement were conducted. The results are shown in Table 3.

EXAMPLE 7

A color proofing image was prepared in the same manner as in Comparative example 1 except for changing the ethylene-vinyl acetate copolymer resin EVAFLEX P-1407 (trade name, produced by Mitsui Du Pont Polychemical Co., vinyl acetate content: 14% by weight, MFR: 15) used in the cushion layer of Comparative example 1 to an ethylene-vinyl acetate copolymer resin (trial resin-A, vinyl acetate content: 14% by weight, MFR: 15) having the same composition, obtained under the same conditions except for carrying out synthetic reaction at a temperature which was about 50° C. lower than the synthetic temperature of EVAFLEX P-1407 for two times or longer of the reaction time of EVAFLEX P-1407. The same evaluation and measurement were conducted. The results are shown in Table 3.

EXAMPLE 8

A color proofing image was prepared in the same manner as in Comparative example 1 except for changing the ethylene-vinyl acetate copolymer resin EVAFLEX P-1407 (trade name, produced by Mitsui Du Pont Polychemical Co., vinyl acetate content: 14% by weight, MFR: 15) used in the cushion layer of Comparative example 1 to an ethylene-vinyl acetate copolymer resin EVA-25K (trade name, produced by Mitsubishi Petrochemical Co., Ltd., vinyl acetate content: 11% by weight, MFR: 3.5). The same evaluation and measurement were conducted. The results are shown in Table 3.

EXAMPLE 9

A color proofing image was prepared in the same manner as in Comparative example 1 except for changing the ethylene-vinyl acetate copolymer resin EVAFLEX P-1407 (trade name, produced by Mitsui Du Pont Polychemical Co., vinyl acetate content: 14% by weight, MFR: 15) used in the cushion layer of Comparative example 1 to an ethylene-vinyl acetate copolymer resin EM-5822 (trade name, produced by Asahi Kasei Co., vinyl acetate content: 8% by weight, MFR: 22). The same evaluation and measurement were conducted. The results are shown in Table 3.

COMPARATIVE EXAMPLE 2

A color proofing image of Example 2 of Japanese Provisional Patent Publication No. 189535/1986 in which the thickness of the second layer was made 0.20 μm was prepared and the same evaluation and measurement were conducted. The results are shown in Table 3.

COMPARATIVE EXAMPLE 3

A color proofing image was prepared in the same manner as in Comparative example 2 except for changing the thickness of the second layer to 0.10 μm and the same evaluation and measurement were conducted. The results are shown in Table 3.

COMPARATIVE EXAMPLE 4

A color proofing image was prepared in the same manner as in Comparative example 2 except for replacing the light-sensitive color image-formable material of Comparative 2 with that of Comparative example 1 and the same evaluation and measurement were conducted. The results are shown in Table 3.

EXAMPLE 10

A color proofing image was prepared in the same manner as in Comparative example 2 except for changing the thickness of the second layer to 0.07 μm and the same evaluation and measurement were conducted. The results are shown in Table 3.

EXAMPLE 11

A color proofing image was prepared in the same manner as in Comparative example 2 except for changing the thickness of the second layer to 0.05 μm and the same evaluation and measurement were conducted. The results are shown in Table 3.

EXAMPLE 12

A color proofing image was prepared in the same manner as in Comparative example 2 except for changing the thickness of the second layer to 0.03 μm and the same evaluation and measurement were conducted. The results are shown in Table 3.

EXAMPLE 13

A color proofing image was prepared in the same manner as in Comparative example 2 except for using the light-sensitive color image-formable material of Comparative example 4 in which the thickness of the second layer was changed to 0.03 μm and the same evaluation and measurement were conducted. The results are shown in Table 3.

EXAMPLE 14

A color proofing image was prepared in the same manner as in Comparative example 1 except for using an ethylene-vinyl acetate copolymer resin (EVA-25K, trade name, vinyl acetate content: 11% by weight, MFR (melt flow rate)=3.5, produced by Mitsubishi Petrochemical Co., Ltd.) in place of the ethylene-vinyl acetate copolymer resin (EVAFLEX-1407, trade name, produced by Mitsui Du Pont Polychemical Co., vinyl acetate content: 14% by weight, MFR (melt flow rate): 15) and using a polyethylene terephthalate film (LUMIRROR T-60 #50, trade name, produced by Toray Co., Ra=0.15 μm (measured by Perthometer S5P, manufactured by Perthen Co.), GS(60°)=170 (JIS-Z 8741, measured by using a digital goniophotometer VG 1D Model (trade name) manufactured by Nihon Denshoku Kogyo Co.) having a thickness of 50 μm in place of the cover sheet for the cushion layer, and the cover sheet of the support having the cushion layer prepared was peeled off so that an angle between the cover sheet and the cushion layer after peeling became 80°. The surface gloss and the number of convex portions of the surface of the cushion layer are shown in Table 1.

By using the resulting support having the cushion layer, a color image-formable material was prepared and a color proofing image was formed in the same manner as in Comparative example 1, and the same evaluation and measurement were conducted. The results are shown in Table 3.

EXAMPLE 15

A color proofing image was prepared in the same manner as in Comparative example 1 except for using an ethylene-vinyl acetate copolymer resin (EVA-25K, trade name, vinyl acetate content: 11% by weight, MFR (melt flow rate)=3.5, produced by Mitsubishi Petrochemical Co., Ltd.) in place of the ethylene-vinyl acetate copolymer resin (EVAFLEX-1407, trade name, produced by Mitsui Du Pont Polychemical Co., vinyl acetate content: 14% by weight, MFR (melt flow rate): 15) and using a polyethylene terephthalate film (LUMIRROR T-60 #50, trade name, produced by Toray Co., Ra=0.15 μm (measured by Perthometer S5P, manufactured by Perthen Co.), GS(60°)=170 (JIS-Z 8741, measured by using a digital goniophotometer VG 1D Model (trade name) manufactured by Nihon Denshoku Kogyo Co.) having a thickness of 50 μm in place of the cover sheet for the cushion layer, and the cover sheet of the support having the cushion layer prepared was peeled off so that an angle between the cover sheet and the cushion layer after peeling became 80°. The surface gloss and the number of convex portions of the surface of the cushion layer are shown in Table 1.

By using the resulting support having the cushion layer, a color image-formable material was prepared and a color proofing image was formed in the same manner as in Comparative example 1, and the same evaluation and measurement were conducted. The results are shown in Table 3.

Next, a color layer dispersion and a light-sensitive layer dispersion having the following compositions were prepared.

| (Color layer dispersion) | |
|---|---|
| Vinyl acetate-vinyl versatate copolymer (weight ratio: 80:20, weight average molecular weight: 50,000, 50% methanol solution) | 10.0 g |
| Pigment shown below | Amount shown below |
| Methyl lactate | 35.2 g |
| (Pigment) | |
| Black: Carbon Black MA-100 (trade name, produced by Mitsubishi Kasei Corporation) | 1.98 g |
| Cyan: Lionol Blue FG-7330 (trade name, produced by Toyo Ink Co.) | 1.10 g |
| Magenta: Lionol Red 6BFG-4219X (trade name, produced by Toyo Ink Co.) | 1.36 g |
| Yellow: Lionol Yellow No. 1206 (trade name, produced by Toyo Ink Co.) | 1.36 g |
| (Light-sensitive layer dispersion) | |
| Esterified compound of p-cresol novolak resin and naphthoquinone-1,2-diazide-4-sulfonic acid chloride | 0.616 g |

-continued

| | |
|---|---|
| Vinyl acetate-vinyl versatate copolymer (weight ratio: 80:20, weight average molecular weight: 50,000, 50% methanol solution) | 8.768 g |
| Pigment shown below | Amount shown below |
| Methyl lactate | 15.2 g |

The above color layer dispersion (coating solution) was coated to have a dry film thickness of 0.9 μm and dried, and then the light-sensitive layer dispersion was coated to have a dry film thickness of 0.9 μm and dried, respectively, to obtain light-sensitive color image-formable materials of four colors.

By using the thus obtained light-sensitive color image-formable material, a color proofing image was formed in the same manner as in Comparative example 1, and the same evaluation and measurement were conducted. The results are shown in Table 3.

In Table 2, the respective film thicknesses of the second layers and the light-sensitive color image-formable materials in Comparative examples 2 to 4 and Examples 10 to 13 are shown.

(Measurement method and device of gloss)

The gloss was measured by using a digital goniophotometer VG 1D Model (trade name) manufactured by Nihon Denshoku Kogyo Co. according to JIS-Z8741 (GS (60°)= Method 3 and GS (75°)=Method 2).

The average gloss (GS (60°) was measured as mentioned below. Method 2 is a 75° mirror surface gloss measured with an incident light angle (θ) of 75°±0.1°, a light receiving angle (θ') of θ±0.1° and applied to a paper, etc., and Method 3 is a 60° mirror surface gloss measured with an incident light angle of 60°±0.2°, a light receiving angle (θ') of θ±0.1° and applied to a plastic, a coating film, enamel, etc.

Measurement conditions are as follows:

| Kind of measurement method | | Method 2 | Method 3 |
|---|---|---|---|
| Incident light angle (θ) | | 75° ± 0.1° | 60° ± 0.2° |
| Light receiving angle (θ') | | θ ± 0.1° | θ ± 0.1° |
| Open angle of light source image | within incident surface ($\alpha_1'$) | 2.85 ± 0.05° | 0.75 ± 0.25° |
| | within vertical surface ($\beta_1$) | 5.70 ± 0.05° | 2.5 ± 0.5° |
| Open angle of light receiver | within incident surface ($\alpha_2$) | 11.5 ± 0.5° | 4.4 ± 0.1° |
| | within vertical surface ($\beta_2$) | Circular | 11.7 ± 0.2° |

The surface roughness was measured by observing a print obtained by using the same manuscript, the same art paper Tokubishi Art (trade name, produced by Mitsubishi Seishi Co.), an ink Mark Five New (trade name, produced by Toyo Ink Co.) and a printer Mitsubishi DAIYA (trade name, manufactured by Mitsubishi Juko Co.).

(Observation and evaluation methods and evaluation standard)

According to the following standard, 15 persons skilled in printing art evaluated differences between the respective images of four colors obtained and the print obtained by using the same manuscript with regard to the respective items shown in Table 3. In Table 3, the respective average values are shown as an average opinion of evaluation.

Evaluation standard

5: No difference from the print is recognized (detectable limit).

4: A difference from the print is recognized, but ignorable (permissive limit).

3: A difference from the print cannot be ignored, but causes no inconvenience (tolerable limit).

2: A difference from the print causes inconvenience.

1: A difference from the print causes great inconvenience.

TABLE 1

| | Resin in cushion layer | Cover sheet of cushion layer | Peeling angle of cover sheet | Mirror finishing treatment after peeling cover sheet | Surface gloss of cushion layer (GS 60°) | Number of convex portions of surface of cushion layer (H = height) | | | Calendering after transfer of image |
|---|---|---|---|---|---|---|---|---|---|
| | | | | | | H ≥ 100 μm | H ≥ 50 μm | H ≥ 30 μm | |
| Comparative example 1 | EVAFLEX P-1407 | LUMIMAT #200S | 160° | None | 9 | 15 | — | — | None |
| Example 1 | EVAFLEX P-1407 | LUMIRROR T-60#50 | 160° | None | 110 | 12 | — | — | None |
| Example 2 | EVAFLEX P-1407 | LUMIRROR T-60#50 | 80° | None | 170 | 17 | — | — | None |
| Example 3 | EVAFLEX P-1407 | LUMIMAT #200S | 160° | 100° C., 1 min | 54 | 13 | — | — | None |
| Example 4 | EVAFLEX P-1407 | LUMIMAT #200S | 160° | 100° C., 2 min | 72 | 12 | — | — | None |
| Example 5 | EVAFLEX P-1407 | LUMIMAT #200S | 160° | Roller: Ra = 0.05 μm, 100° C., 5 kgf/cm², 0.5 m/min | 190 | 5 | 19 | — | None |
| Example 6 | EVAFLEX P-1407 | LUMIMAT #200S | 160° | None | 9 | 17 | — | — | Roller: Ra = 0.15 μm, 100° C., 3 kgf/cm², 2 m/min |
| Example 7 | Trial resin A | LUMIMAT #200S | 160° | None | 8 | 3 | 12 | — | None |
| Example 8 | EVA-25K | LUMIMAT #200S | 160° | None | 9 | 1 | 8 | 22 | None |
| Example 9 | EM-5822 | LUMIMAT #200S | 160° | None | 9 | 0 | 3 | 9 | None |
| Examples 14 and 15 | EVA-25K | LUMIRROR T-60#50 | 80° | None | 170 | 2 | 11 | — | None |

TABLE 2

| | Film thickness of second layer (μm) | Light-sensitive color image-forming material |
|---|---|---|
| Comparative example 2 | 0.20 | Light-sensitive color image-formable material described in Example 2 of Japanese Provisional Patent Publication No. 189535/1986 |
| Comparative example 3 | 0.10 | Light-sensitive color image-formable material described in Comparative example 2 |
| Comparative example 4 | 0.10 | Light-sensitive color image-formable material described in Comparative example 1 |
| Example 10 | 0.07 | Light-sensitive color image-formable material described in Comparative example 2 |
| Example 11 | 0.05 | Light-sensitive color image-formable material described in Comparative example 2 |
| Example 12 | 0.03 | Light-sensitive color image-formable material described in Comparative example 2 |
| Example 13 | 0.03 | Light-sensitive color image-formable material described in Comparative example 1 |

TABLE 3

| | Surface gloss (JIS-Z8741) GS (75°) (average of five measurements) | | Evaluation of observation (average opinion of evaluation) | | | | |
|---|---|---|---|---|---|---|---|
| | | | Image portion | | | Non-image portion | |
| | Image portion | Non-image portion | Gloss (luster) | Quality | Density uniformity | Gloss (luster) | Quality |
| Comparative example 1 | 36 | 68 | 1.4 | 4.4 | 2.4 | 4.8 | 4.9 |
| Example 1 | 74 | 68 | 4.2 | 4.7 | 2.4 | 4.8 | 4.9 |
| Example 2 | 82 | 68 | 4.7 | 4.7 | 2.3 | 4.7 | 4.9 |
| Example 3 | 48 | 68 | 2.6 | 4.3 | 2.5 | 4.8 | 4.9 |
| Example 4 | 65 | 68 | 3.5 | 4.6 | 2.4 | 4.8 | 4.9 |
| Example 5 | 89 | 68 | 4.7 | 4.7 | 3.0 | 4.7 | 4.9 |
| Example 6 | 84 | 71 | 4.7 | 4.5 | 2.4 | 4.3 | 4.2 |
| Example 7 | 37 | 68 | 1.3 | 4.4 | 3.5 | 4.8 | 4.9 |
| Example 8 | 35 | 68 | 1.2 | 4.3 | 4.1 | 4.8 | 4.9 |
| Example 9 | 32 | 68 | 1.3 | 4.3 | 4.6 | 4.8 | 4.9 |
| Example 14 | 84 | 68 | 4.7 | 4.7 | 4.2 | 4.8 | 4.9 |
| Example 15 | 83 | 68 | 4.7 | 4.7 | 4.1 | 4.8 | 4.9 |
| Comparative example 2 | 94 | 89 | 4.0 | 3.8 | 4.6 | 2.9 | 2.9 |
| Comparative example 3 | 93 | 85 | 4.3 | 3.9 | 4.7 | 3.1 | 3.2 |
| Comparative example 4 | 93 | 84 | 4.4 | 4.2 | 2.5 | 3.2 | 4.0 |
| Example 10 | 90 | 74 | 4.5 | 4.4 | 4.5 | 4.0 | 4.3 |
| Example 11 | 89 | 72 | 4.7 | 4.6 | 4.6 | 4.2 | 4.6 |
| Example 12 | 89 | 69 | 4.7 | 4.5 | 4.5 | 4.5 | 3.1 |
| Example 13 | 90 | 70 | 4.6 | 4.7 | 2.4 | 4.5 | 4.6 |
| Print | 88 | 68 | — | — | — | — | — |

According to the present invention, it is possible to provide a color image-formable material which can give a color proof more approximate to a print, particularly a color image-formable material which ① can give a color proof having surface characteristics of an image approximate to those of a print and ② can give a color proof approximate to a print by controlling non-uniformity of an image portion caused by a surface portion of a cushion layer, a process for preparing the same and a method of forming a transferred image using the same.

We claim:

1. A color image-formable material which comprises a support, a cushion layer provided on the support and a color light-sensitive layer containing a light-sensitive composition and a coloring agent and gives a transferred image by forming a color image portion by imagewise exposure and developing treatment and then transferring the color image portion alone to an image-receiving material, wherein the surface at a color light-sensitive layer side of the cushion layer has an average gloss (GS (60°)) of 30 or more and the color light-sensitive layer is provided on the cushion layer.

2. The material of claim 1 wherein the cushion layer contains a polymer having vinyl carboxylate as a polymerization unit, and an amount of a polymerized portion derived from said vinyl carboxylate is 11% by weight or less based on the total amount of the polymer.

3. The material of claim 1 wherein the surface at a color light-sensitive layer side of the cushion layer has an average gloss (GS (60°)) of 70 or more.

4. The material of claim 3 wherein the surface at a color light-sensitive layer side of the cushion layer has an average gloss (GS (60°)) of 100 or more.

5. The material of claim 1 wherein the cushion layer comprises at least one selected from the group consisting of a polyethylene, a polypropylene, a copolymer of ethylene and vinyl acetate, a copolymer of ethylene and an acrylic acid ester, a copolymer of ethylene and acrylic acid, polyvinyl acetate, and a vinyl acetate copolymer.

6. A process for preparing a color image-formable material of claim 1 which comprises the steps of:

making the average gloss (GS (60°)) of the surface at the color light-sensitive layer side of the cushion layer 30 or more and, thereafter, providing the color light-sensitive layer on the cushion layer.

7. The process of claim 6 wherein the step of making the average gloss 30 or more comprises the steps of:

laminating a cover sheet on the cushion layer and peeling the cover sheet.

8. The process of claim 7 wherein the surface at a cushion layer side of the cover sheet has an average gloss (GS (60°)) of 30 or more and an average center line roughness (Ra) of 0.3 μm or less.

9. The process of claim 6 wherein the surface of the cushion layer is subjected to mirror finishing treatment after peeling the cover sheet and before providing the color light-sensitive layer.

10. The process of claim 7 wherein the surface of the cushion layer is subjected to mirror finishing treatment after peeling the cover sheet and before providing the color light-sensitive layer.

11. The process of claim 6 wherein the cushion layer contains a polymer having vinyl carboxylate as a polymerization unit, and an amount of a polymerized portion derived from said vinyl carboxylate is 11% by weight or less based on the total amount of the polymer.

12. The process of claim 6 wherein the surface at a color light-sensitive layer side of the cushion layer has an average gloss (GS (60°)) of 70 or more.

13. The process of claim 12 wherein the surface at a color light-sensitive layer side of the cushion layer has an average gloss (GS (60°)) of 100 or more.

14. The process of claim 7 wherein the peeling is carried out with a peeling angle from the surface of the cushion layer of 90° or less.

15. The process of claim 14 wherein the peeling is carried out with a peeling angle from the surface of the cushion layer of 80° or less.

16. The process of claim 6 wherein the cushion layer comprises at least one selected from the group consisting of a polyethylene, a polypropylene, a copolymer of ethylene and vinyl acetate, a copolymer of ethylene and an acrylic acid ester, a copolymer of ethylene and acrylic acid, polyvinyl acetate, and a vinyl acetate copolymer.

* * * * *